(12) United States Patent
Li et al.

(10) Patent No.: US 11,728,423 B2
(45) Date of Patent: Aug. 15, 2023

(54) INTEGRATED PLANAR-TRENCH GATE POWER MOSFET

(71) Applicant: Alpha and Omega Semiconductor International LP, Toronto (CA)

(72) Inventors: Wenjun Li, Portland, OR (US); Lingpeng Guan, San Jose, CA (US); Jian Wang, Portland, OR (US); Lingbing Chen, Portland, OR (US)

(73) Assignee: ALPHA AND OMEGA SEMICONDUCTOR INTERNATIONAL LP, Toronto (CA)

(*) Notice: Subject to any disclaimer, the term of this patent is extended or adjusted under 35 U.S.C. 154(b) by 180 days.

(21) Appl. No.: 17/237,461

(22) Filed: Apr. 22, 2021

(65) Prior Publication Data
US 2022/0344505 A1 Oct. 27, 2022

(51) Int. Cl.
| | | |
|---|---|---|
| H01L 29/78 | (2006.01) | |
| H01L 29/06 | (2006.01) | |
| H01L 29/10 | (2006.01) | |
| H01L 29/66 | (2006.01) | |
| H01L 21/266 | (2006.01) | |
| H01L 21/761 | (2006.01) | |
| H01L 21/265 | (2006.01) | |

(52) U.S. Cl.
CPC ........ *H01L 29/7813* (2013.01); *H01L 21/266* (2013.01); *H01L 21/26513* (2013.01); *H01L 21/761* (2013.01); *H01L 29/0634* (2013.01); *H01L 29/1095* (2013.01); *H01L 29/66734* (2013.01)

(58) Field of Classification Search
CPC ..... H01L 29/06; H01L 29/0634; H01L 29/10; H01L 29/1095; H01L 29/66; H01L 29/66734; H01L 29/78; H01L 29/7813; H01L 21/26; H01L 21/26513; H01L 21/76; H01L 21/761
USPC .......................................................... 257/330
See application file for complete search history.

(56) References Cited

U.S. PATENT DOCUMENTS

| | | |
|---|---|---|
| 7,800,170 B1 | 9/2010 | He et al. |
| 8,138,605 B2 | 3/2012 | Chang et al. |
| 8,193,580 B2 | 6/2012 | Chen et al. |
| 8,236,651 B2 | 8/2012 | Chen et al. |
| 8,431,457 B2 | 4/2013 | Chang et al. |
| 8,564,055 B2 | 10/2013 | Chen et al. |
| 8,580,676 B2 | 11/2013 | Chang et al. |
| 8,779,510 B2 | 7/2014 | Yilmaz et al. |

(Continued)

FOREIGN PATENT DOCUMENTS

JP 2017118024 * 6/2017 ............. H01L 29/78

*Primary Examiner* — Fazli Erdem
(74) *Attorney, Agent, or Firm* — JDI Patent; Joshua D. Isenberg; Robert Pullman

(57) ABSTRACT

Transistor device and method of making thereof comprising a substrate heavily doped with a first conductivity type and an epitaxial layer lightly doped with the first conductivity type on top of the substrate. A body region doped with a second conductivity type is formed in the epitaxial layer wherein the second conductivity type is opposite the first conductivity type and a source region doped with the first conductivity type is formed in the body region of the epitaxial layer. An integrated planar-trench gate having a planar gate portion is formed on the surface of the epitaxial layer that is contiguous with a gate trench portion formed in the epitaxial layer.

19 Claims, 12 Drawing Sheets

(56) References Cited

U.S. PATENT DOCUMENTS

| | | |
|---|---|---|
| 8,994,101 B2 | 3/2015 | Chang et al. |
| 9,048,282 B2 | 6/2015 | Hu et al. |
| 9,252,239 B2 | 2/2016 | Yilmaz et al. |
| 9,252,265 B2 | 2/2016 | Chang et al. |
| 9,281,368 B1 | 3/2016 | Lee et al. |
| 9,691,863 B2 | 6/2017 | Xue et al. |
| 9,741,808 B2 | 8/2017 | Lee et al. |
| 9,793,393 B2 | 10/2017 | Chen et al. |
| 9,865,694 B2 | 1/2018 | Lee et al. |
| 10,014,381 B2 | 7/2018 | Yilmaz et al. |
| 10,020,380 B2 | 7/2018 | Li et al. |
| 10,170,559 B1 | 1/2019 | Xue et al. |
| 10,424,654 B2 | 9/2019 | Li et al. |
| 10,608,092 B2 | 3/2020 | Yilmaz et al. |
| 10,644,102 B2 | 5/2020 | Padmanabhan et al. |
| 10,644,118 B2 | 5/2020 | Xue et al. |
| 10,680,097 B2 | 6/2020 | Chen et al. |
| 10,686,038 B2 | 6/2020 | Xue et al. |
| 10,833,021 B2 | 11/2020 | Zhang et al. |
| 10,910,478 B1 * | 2/2021 | Xu .................. H01L 29/7802 |
| 2011/0037120 A1 | 2/2011 | Chen et al. |
| 2011/0039383 A1 | 2/2011 | Chen et al. |
| 2011/0095361 A1 | 4/2011 | Chang et al. |
| 2011/0220990 A1 | 9/2011 | Chang et al. |
| 2012/0129328 A1 | 5/2012 | Chang et al. |
| 2012/0205737 A1 | 8/2012 | Chen et al. |
| 2014/0091386 A1 | 4/2014 | Chen et al. |
| 2016/0218008 A1 | 7/2016 | Li et al. |
| 2018/0269293 A1 | 9/2018 | Yilmaz et al. |
| 2018/0323282 A1 | 11/2018 | Li et al. |
| 2019/0006285 A1 | 1/2019 | Zhang et al. |
| 2019/0221644 A1 * | 7/2019 | Hu .................. H01L 29/0878 |

* cited by examiner

INTEGRATED PLANAR-TRENCH GATE POWER MOSFET

FIELD OF THE INVENTION

Aspects of the present disclosure generally relate to transistors and more particularly to Vertical Double-Diffused metal oxide semiconductor (VDMOS) field effect transistors and Trench Gate metal oxide semiconductor field effect transistors (MOSFETs).

BACKGROUND OF THE INVENTION

The consumer market demands ever-smaller devices. Additionally, computing power and performance increases with an increase in the number of transistors that can fit on a single wafer. Cooling and power usage decreases with a reduction of on-resistance (Rdson) by reducing transistor pitch.

Currently for high voltage applications, there exists a limitation on the pitch of planar transistors. As the distance between body regions sharing a gate decreases the lateral depletion rate of the charge carriers in the JFET region between the two body regions increases. This leads to an increase in the Resistance from drain to source ($R_{DS}$). A solution to this is to increase the doping concentration of the JFET region but there are limits to the resulting size decrease.

It is within this context that aspects of the present disclosure arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Figure 1:
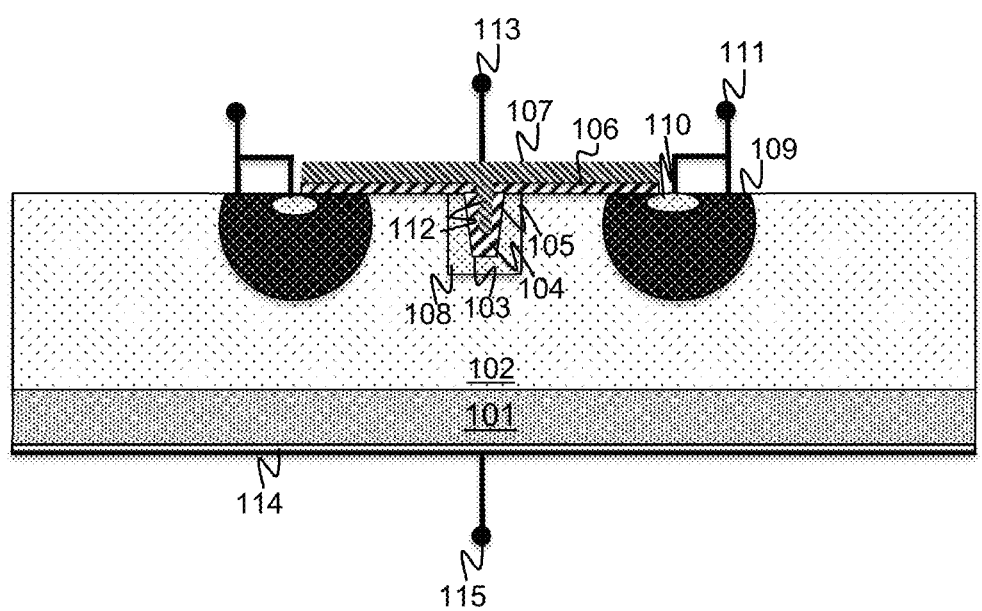
FIG. 1 depicts a side cut away view of the integrated planar-trench gate transistor device according to aspects of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

The disclosure herein refers silicon doped with ions of a first conductivity type or a second conductivity. The ions of the first conductivity type may be opposite ions of a second conductivity type. For example, ions of the first conductivity type may be n-type, which create charge carriers when doped into silicon. Ions of the first conductivity type include phosphorus, antimony, bismuth, lithium and arsenic. Ions of the second conductivity may be p-type, which create holes for charge carriers when doped into silicon and in this way are referred to as being the opposite of n-type. P-type type ions include boron, aluminum, gallium and indium. While the above description referred to n-type as the first conductivity type and p-type as the second conductivity the disclosure is not so limited, p-type may be the first conductivity and n-type may be second the conductivity type.

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (p or n) refers generally to a relative degree of concentration of designated type of net impurity carriers within a semiconductor material. In general terms, an n+ material has a higher n type net dopant (e.g., electron) concentration than an n material, and an n material has a higher carrier concentration than an n− material. Similarly, a p+ material has a higher p type net dopant (e.g., hole) concentration than a p material, and a p material has a higher concentration than a p− material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

Introduction

According to aspects of the present disclosure, the pitch of transistor devices may be improved by creating an integrated planar-trench gate having a contiguous gate portion and trench portion. The integrated planar-trench gate allows for smaller planar gate sizes and reduces $R_{DS}$. Prior devices have implemented a combination of a planar gate and a trench gate separated by an insulating layer and electrically coupled via wires. These prior devices were made with a large deep trench and it was therefore impossible to form an integrated gate-trench that was contiguous between the gate portion and the trench portion having a flat planar gate. Filing the larger trenches of prior devices with insulating layers and conductive layers resulted in gates that were not sufficiently flat. An intermediate insulating layer between the planar gate and the trench gate was used to create a flat gate. Creating an opening through the insulating layer between the planar gate and the trench gate to electrically couple the two gates was impractical because of difficulties in alignment of the trench gate and planar gate. As such, the planar gate and the trench gate were electrically connected using wire leads instead of direct contact between the conductive layers of the two gates. The deep trench and indirect connection of the two gates in prior devices increased the complexity of prior devices and made shrinking the size of the prior devices difficult.

In solution to this a transistor device and method of making thereof has been devised, the transistor device comprising a substrate heavily doped with a first conductivity type and an epitaxial layer lightly doped with the first conductivity type on top of the substrate. A body region doped with a second conductivity type opposite the first conductivity type is formed in the epitaxial layer and a source region doped with the first conductivity type is formed in the body region of the epitaxial layer. The device includes an integrated planar-trench gate having a planar gate portion is formed on the surface of the epitaxial layer that is contiguous with a trench gate portion formed in a trench in the epitaxial layer. In some implementations, the device may further include a localized JFET implant region, heavily doped with first conductivity type formed around the bottom and sides of the trench gate portion. A region of the epitaxial layer lightly doped with the first conductivity type may separate the localized JFET implant and the body region. In some implementations, the trench gate portion may be formed in the body region of the epitaxial layer.

In some other implementations, the depth of a bottom of the trench gate portion in the substrate may be less than a lowest doped depth of the body region. In other implementations, the trench-gate portion may be insulated from the epitaxial layer by a thick insulating layer at a bottom of the gate trench that is thicker than an insulating layer on at least one side of the gate trench. In yet other implementations, the epitaxial layer may further include alternating body region columns doped with the second conductivity type and columns of epitaxial layer lightly doped with the first conductivity type that form a so-called superjunction structure. The sidewalls of a trench of the gate trench portion of the device may intersect with a bottom of the trench of the gate trench portion at an angle that is greater than 90 degrees in some implementations. The gate trench portion of the transistor device may have a trench depth of between 0.3 and 0.8 micrometers. The device may have a width of the insulating layer at the bottom a trench of the gate trench portion may be 1.5 to 2 times as thick as insulating layer on a side of the trench in some implementations of the present disclosure.

Device

FIG. 1 depicts a side cut away view of the integrated planar-trench gate transistor device according to aspects of the present disclosure. As shown, the integrated planar-trench gate transistor device includes a substrate 101 heavily doped with ions of a first conductivity type. An epitaxial layer 102 may be formed on top of the substrate 101. By way of example, and not by way of limitation, the epitaxial layer 102 may be grown on a surface of the substrate 101 using epitaxial growth or otherwise deposited on the surface of the substrate. A trench 103 is formed in the epitaxial layer 102. In some implementations, a region around the sides and bottom of the trench 103 may be heavily doped with ions of the first conductivity type, forming a localized JFET implant region 108. A dielectric layer 106 is formed on the surface of the substrate to electrically insulate the planar gate portion 107 of the integrated planar-trench gate from the epitaxial layer 102. The dielectric layer 106 also lines sidewalls and bottom of the trench 103 creating the insulating layer for the sidewalls 105 and bottom 104 of the trench portion of the integrated planar-trench gate. In some implementations, the insulating layer on the bottom 104 of the trench 103 may be 1.5 to 2 times as thick as the insulating layer on the sides 103 of the trench referred herein as the thick bottom insulator. The insulating layers may be comprised of dielectric materials such as silicon oxide. The planar gate portion 107 may be formed by patterning a conductive layer formed on a surface of the insulating layer 106. Part of the conductive layer fills portions of the trench 103 that are not occupied by the dielectric layer 106 and is insulated from the epitaxial layer 102 by portions of the insulating layer on the sidewalls 105 and bottom 104 of the trench. The conductive layer creates the integrated planar-trench gate that is contiguous between the planar portion 107 of the gate and the trench portion 112 of the gate. The conductive layer may be comprised of polycrystalline silicon or other conductive material such as Titanium Nitride (TiN) or Tungsten. A gate contact 113 is coupled to the conductive layer 107. Due to the contiguous nature of planar gate portion 107 and trench gate portion 112 of the gate, the trench portion 112 does not have a separate gate contact. The trench portion 112 is instead maintained at gate potential levels by virtue of being contiguous with the planar gate portion 107 of the gate. One or more body regions 109 may be formed in the epitaxial layer 102. Source regions 110 may be formed in the body 109 of the epitaxial layer 102. A source contact 111 couples the source region to the source and may also include a body short contact. A drain metal 114 may be formed on the bottom of the substrate 101. A drain contact 115 may be coupled to the drain metal 114.

During operation, a gate potential at the gate contact 113 allows current to be conducted through the transistor device. For example and without limitation in an N type MOSFET configuration, current applied to the drain contact 115 is conducted through the drain metal 114 and through the substrate 101, and epitaxial layer 102. Charge carriers from the epitaxial layer 102 combine with oppositely-charged holes in the body region 109 allowing current to be conducted to the source region 110 and the source contact 111.

Figure 2:
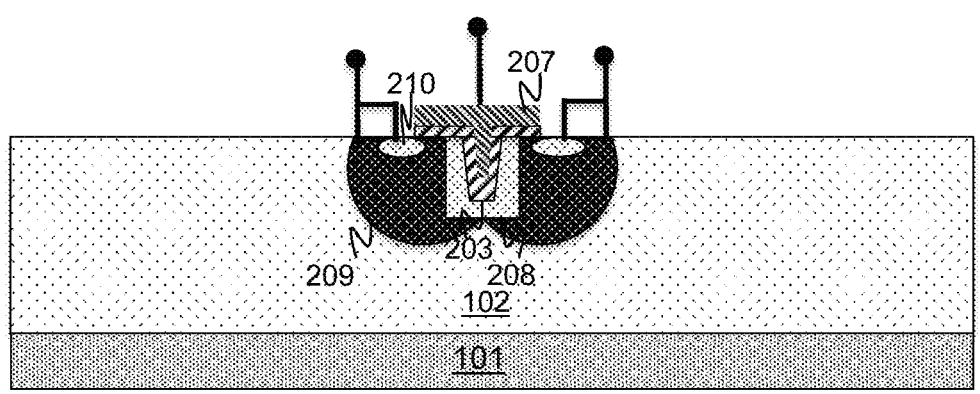
FIG. 2 shows a side cut away view of an alternative implementation of the integrated planar-trench gate transistor device according to aspects of the present disclosure.

FIG. 2 shows a side cut away view of an alternative implementation of the integrated planar-trench gate transistor device according to aspects of the present disclosure. In the implementation shown in FIG. 2, the body region 209 touches a localized junction field-effect transistor (JFET) implant region 208. Additionally the source region 210 is located closer to the gate trench 203 than in implementations without intersecting body regions and an integrated planar-trench gate. As shown, the two body regions 209 are arranged so close to the trench 203 that the regions intersect underneath the trench 203. The planar portion 207 of the integrated planar-trench gate is shorter than in implementations that do not include intersecting body regions underneath the trench. The integrated planar-trench gate and localized JFET implant 208 allows for a decrease in the pitch of transistor device as the width of the planar portion 207 of the integrated planar-trench gate may be reduced without significantly influencing the $R_{DS}$ of the device.

Figure 3:
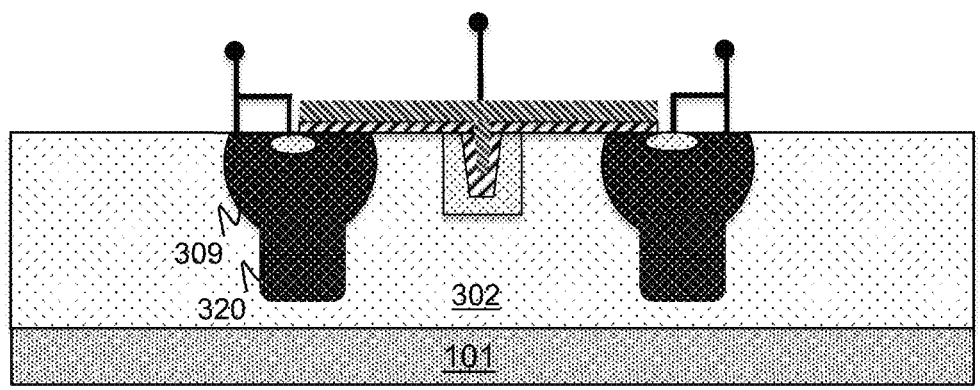
FIG. 3 depicts shows a side cut away view of super junction transistor device having the integrated planar-trench gate according to aspects of the present disclosure.

FIG. 3 depicts shows a side cut away view of super junction transistor device having the integrated planar-trench gate according to aspects of the present disclosure. As shown, the body regions 309 of the device include columns 320 doped with ions of the second conductivity type that terminate near the substrate 101. The epitaxial layer 302 forms columns doped with ions of the first conductivity type. Thus, the combination of doped body columns 320 and regions of the epitaxial layer doped with ions of the first conductivity 302 creates alternating columns doped with first conductivity type and second conductivity type in the epitaxial layer respectively for a super junction device.

Method of Making

Figure 4A:
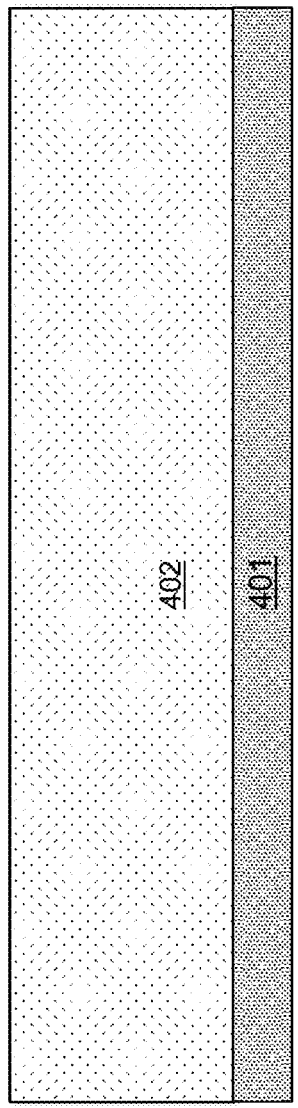
FIG. 4A shows a substrate that is heavily doped with ions of the first conductivity type and an epitaxial layer that is more lightly doped according to aspects of the present disclosure.

FIGS. 4A-4J show a side cut away view of the method of making the integrated planar-trench gate transistor device according to aspects of the present disclosure. FIG. 4A shows a substrate 401 that is heavily doped with ions of the first conductivity type and an epitaxial layer 402 that is more lightly doped according to aspects of the present disclosure. The substrate 401 may be doped at an ion concentration of between $1 \times 10^{19}$ and $1 \times 10^{20}$ cm$^{-3}$. The substrate may be composed of, for example and without limitation, silicon, silicon carbide, gallium nitride or gallium arsenide. An epitaxial layer 402 may be formed on a surface of the substrate 401. The epitaxial layer 402 may be grown on the top surface of the epitaxial layer 401 by such processes as vapor phase epitaxy. The epitaxial layer 402 may be lightly doped with ions of the first conductivity type during or after formation. The epitaxial layer 402 may be doped at an ion concentration of between $1 \times 10^{17}$ and $6 \times 10^{17}$ cm$^{-3}$.

Figure 4B:
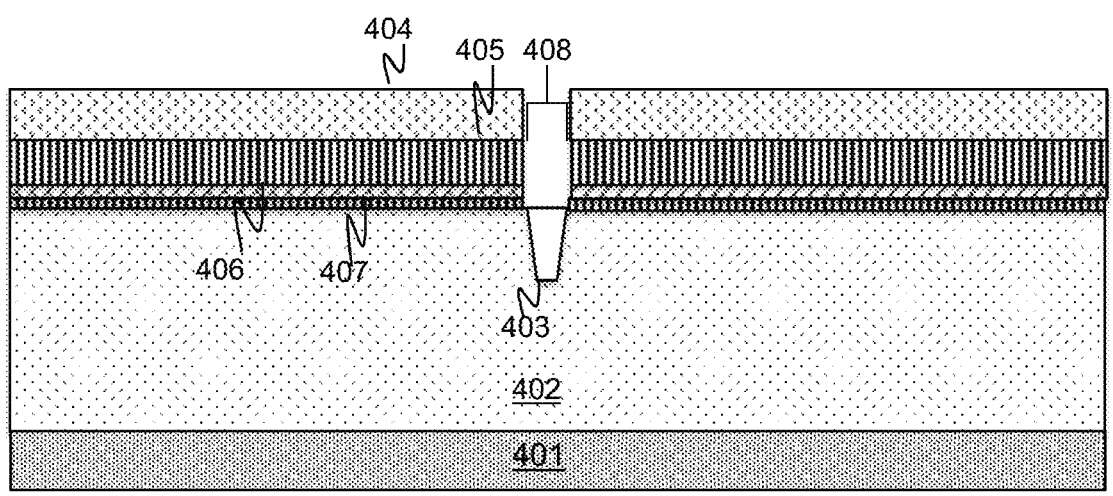
FIG. 4B depicts a side cut away view of formation of a trench in the epitaxial layer for the integrated planar-trench gate transistor device according to aspects of the present disclosure.

FIG. 4B depicts a side cut away view of formation of the trench 403 in the epitaxial layer 402 for the integrated planar-trench gate transistor device according to aspects of the present disclosure. Initially a hard mask comprised of a silicon oxide layer 407, Silicon nitride layer 406, silicon oxide layer 405 stack may be deposited on the surface of the epitaxial layer 402. The oxide layer, 407, 405 and nitride layer 406 may be formed with by chemical vapor deposition techniques (CVD) to form $SiO_2$ and Silicon Nitride or by a thermal oxidation process to form $SiO_2$. A mask pattern 404 is formed on a surface of the hard mask. The mask pattern 404 may be created using photolithography techniques or applied by a mechanical masking process. The mask pattern 404 includes a trench gap 408. An etching process such as plasma dry etch or a wet etching using phosphoric acid or other such selecting etchant is applied to the mask pattern and hard mask. The hard mask is etched away at the trench gap 408 exposing the epitaxial layer 402 in the trench gap. The epitaxial layer 402 may then be etched to a desired depth through the trench gap 408 by plasma etching techniques such as deep reactive ion etching (DRIE). The depth of the trench 403 created may be between 0.3 micrometers (μm) and 0.8 μm into the epitaxial layer. Alternatively, the depth of the trench may be selected based on the desired device characteristics. The general effect on trench depth is that as the spacing between two P-type body regions decreases the depth of the trench increases. The sides of the trench 403 may be formed with an angle such that a side of the trench intersects with the bottom of the trench at greater than 90 degrees with respect to the surface of the epitaxial layer 402. For example and without limitation the angle created by a side of the trench and the surface of the epitaxial layer 402 at the bottom of the trench may be between 101 and 105 degrees.

Figure 4C:
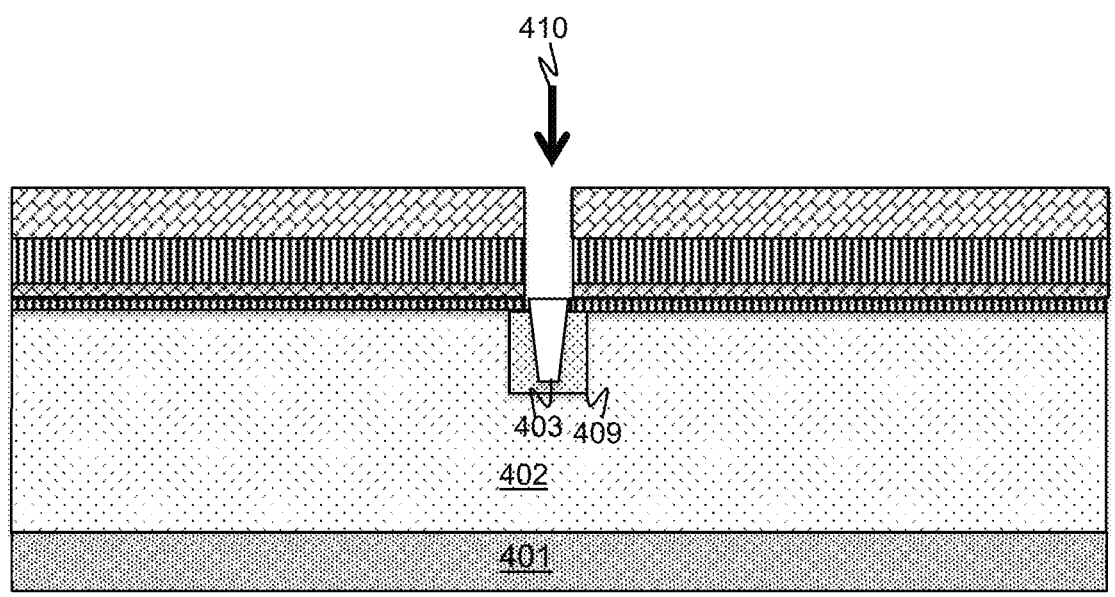
FIG. 4C depicts a side cut away view of formation of a localized JFET implant region according to aspects of the present disclosure.

FIG. 4C depicts a side cut away view of formation of the localized JFET implant region 409 according to aspects of the present disclosure. As shown a localized JFET implant region 409 may be formed in the epitaxial layer 402 around the bottom and sides of the trench 403. In some implementations, a localized JFET implant region 409 may be formed by ion implantation 410 through the pattern mask and hard mask. The localized JFET implant region 411 may be heavily doped with ions of the first conductivity type. The localized JFET implant region may be doped at an ion concentration that is 2 to 3 times that of the epitaxial layer. The localized JFET implant region may reduce the depletion charge carriers and therefore aid in reducing the $R_{DS}$ of the device.

Figure 4D:
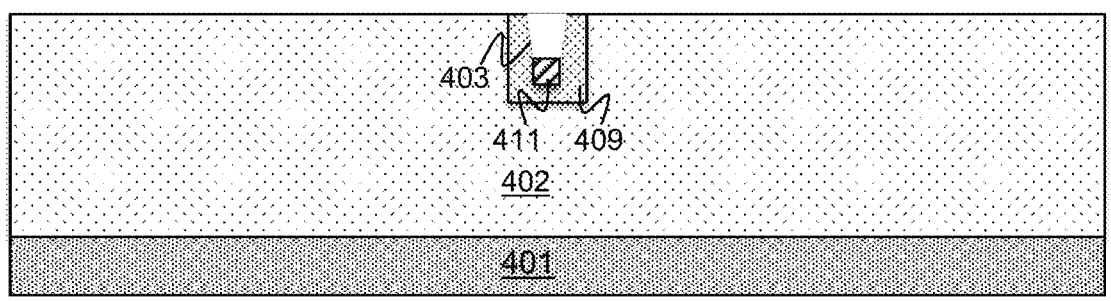
FIG. 4D shows a cut away view of formation of a thick bottom insulating layer at the bottom of the trench according to aspects of the present disclosure.

FIG. 4D shows a cut away view of formation of a thick bottom insulating layer 411 at the bottom of the trench 403 according to aspects of the present disclosure. The thick bottom insulating layer 411 may be formed by deposition techniques such as high density plasma (HDP) deposition or chemical vapor deposition techniques (CVD). The thick bottom insulating layer may be comprised of silicon oxide or nitride or ONO ($SiO_2$/nitride/$SiO_2$) film. A plasma dry etch or wet etch is then applied to the side walls of the trench 403 to remove any excess insulating layer deposited on the sides of the trench. The thick bottom insulating layer is initially formed with a thickness of between 1500 and 2500 angstroms (Å). In some embodiments the final thickness of thick bottom insulating layer is 1.5 to 2 times the thickness of the insulating layer of the sidewall of the trench, this final thickness is achieved after insulating layer has been formed on the sides and bottom of the trench as seen in FIG. 4E.

Figure 4E:
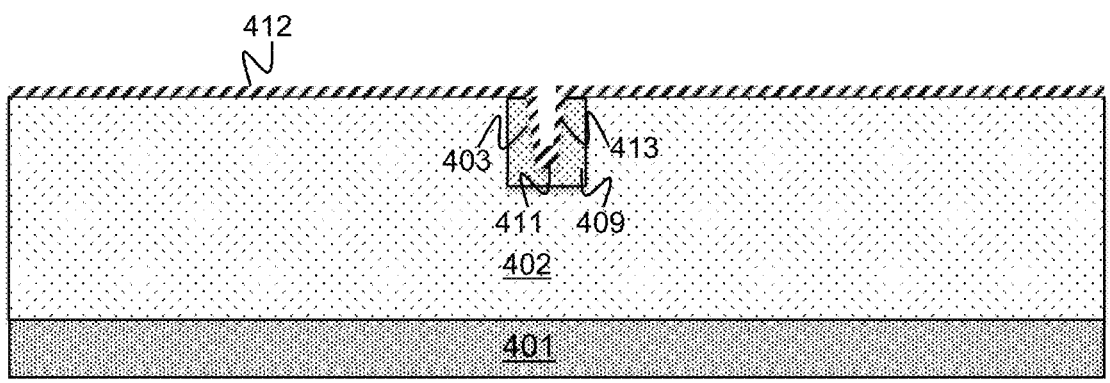
FIG. 4E shows a cut away side view of formation of a gate insulating layer having a planar portion and a trench portion according to aspects of the present disclosure.

FIG. 4E shows a cut away side view of formation of a gate insulating layer having a planar portion 412 and a trench portion 413 according to aspects of the present disclosure. As shown an insulating layer is deposited over the surface of the epitaxial layer 402. The planar portion 412 of the insulating layer on the surface of the epitaxial layer 402 will form part of the planar portion of the integrated planar-trench gate. Insulating layer material is also deposited on the bottom and sidewalls 413 of the trench 403. In implementations, having the thick bottom insulating layer the insulating material is deposited on top of the previously deposited insulating material creating the final thickness of the thick bottom insulating layer 411. The insulating layer may be comprised of a silicon oxide. The planar portion 412 of the insulating layer and the trench portion 413 on the bottom of the trench 403 may be about the same thickness, e.g., between 800 and 1000 angstroms thick.

Figure 4F:
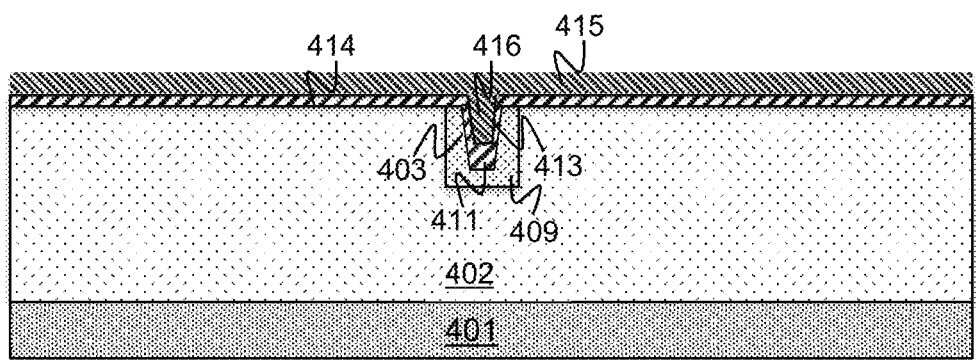
FIG. 4F depicts a cut away side view of formation of an integrated planar-trench gate having a conductive layer with a contiguous planar portion and trench portion according to aspects of the present disclosure.

As depicted in FIG. 4F, the conductive layer includes a planar portion 415 on the planar portion 412 of the insulating layer and a trench portion 416. The conductive layer may be deposited on a surface of the insulating layer. The trench portion 416 of the conductive layer fills portions of the trench 413 not occupied by portions of the insulating layer including the thick bottom insulator (optional) 411 and the insulating layer on the side of the trench 413. The planar portion 415 of the conductive layer covers the planar portion 412 of the insulating layer. The techniques described herein create an extremely flat surface of the conductive layer over both the planar portion and the trench portion of the insulating layer without formation of an intermediate insulating layer between the planar and trench portions.

Figure 4G:
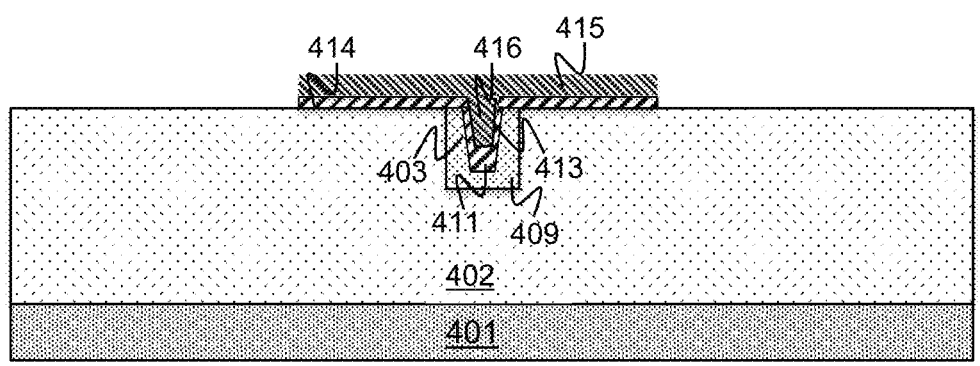
FIG. 4G depicts a cut away side view of formation of an integrated planar-trench gate having a patterned conductive layer forming a gate with a contiguous planar gate portion and trench gate portion according to aspects of the present disclosure.

FIG. 4G depicts a cut away side view of formation of an integrated planar-trench gate after patterning the conductive layer to form a planar-trench gate having a contiguous planar gate portion 415 and trench gate portion 416 according to aspects of the present disclosure. The conductive layer 415 is masked and etched away leaving the final dimensions of the planar-trench gate. After the mask is removed, the planar gate portion 415 may then act as a mask for a subsequent etching of the planar portion 412 of the insulating layer. Preferably, the process that etches the conductive layer is selective to the material of the conductive layer, i.e., etches the material of the insulating layer at a much lower rate than the conductive layer material. Conversely, the process that etches the insulating layer is selective to the material of the insulating layer, i.e., etches the conductive layer at a much lower rate than the insulating layer.

Figure 4H:
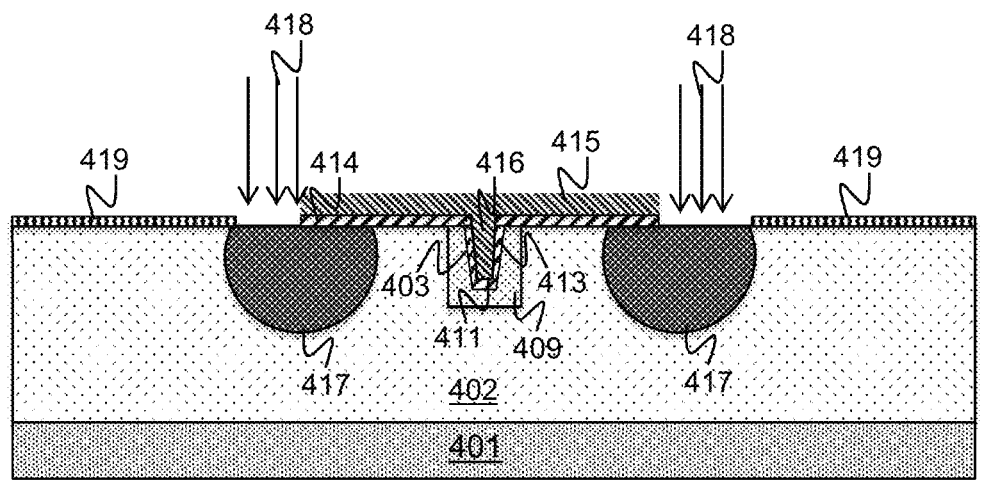
FIG. 4H shows a cut away side view of formation of body regions for a transistor device having an integrated planar-trench gate according to aspects of the present disclosure.

FIG. 4H shows a cut away side view of formation of body regions 417 for a transistor device having an integrated planar-trench gate according to aspects of the present disclosure. A mask 419 may be formed on the surface of the epitaxial layer with gaps in the location for the body region 417. The mask may be a photo resist mask applied to the surface of the epitaxial layer. Ion implantation 418 may be used to dope the epitaxial layer 402 with ions of the second conductivity type (e.g. if the first conductivity type is n-type then the second conductivity type is p-type). After forming the body region 417, the mask 419 may be removed by plasma ashing and washing with a removal solution or any other known mask removal technique for example and without limitation planarization or polishing.

In some implementations, the body regions may be formed before formation of the trench and the integrated planar trench gate. In these implementations, the trench may be formed in body region of the epitaxial layer. The localized JFET implant region may then be formed in the body region via counter ion doping. This implementation of the method may be used to produce the device seen in FIG. 2. In yet other implementations, doped columns may be formed under the body region. These doped columns form a superjunction device such as the one shown in FIG. 3.

Figure 4I:
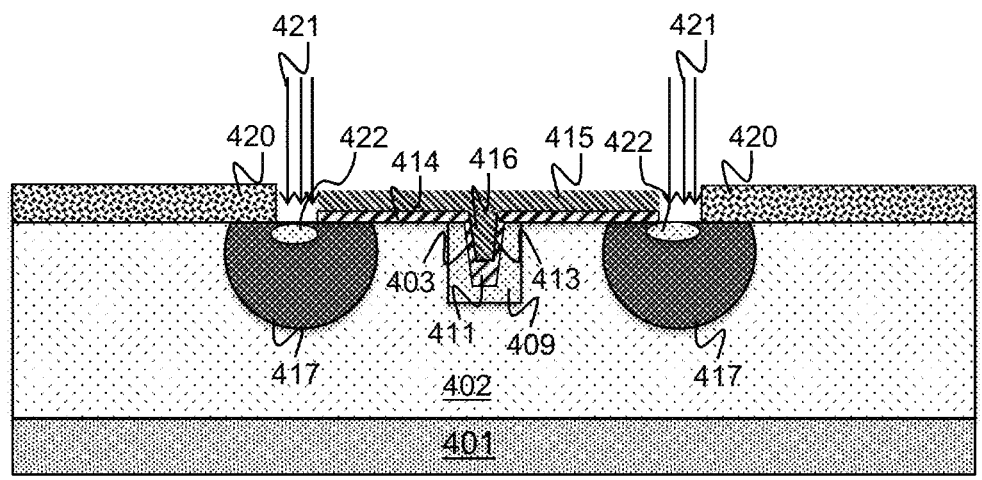
FIG. 4I depicts a cut away side view of formation of source regions for a transistor device having an integrated planar-trench gate according to aspects of the present disclosure.

FIG. 4I depicts a cut away side view of formation of source regions for a transistor device having an integrated planar-trench gate according to aspects of the present disclosure. A source mask 420 may be formed on the surface of the epitaxial layer with gaps at the locations for the source region 422. One or more source regions 422 may be formed in the body region 417 of the epitaxial layer 402 via implantation of ions 421 through openings in the source mask 420. The source region(s) 422 may be doped with ions of the first conductivity type at a concentration greater than the epitaxial layer. After formation of the source region(s) 422, the source mask 420 may be removed by plasma ashing and washing with a removal solution of any other known mask removal technique for example and without limitation planarization or polishing.

Figure 4J:
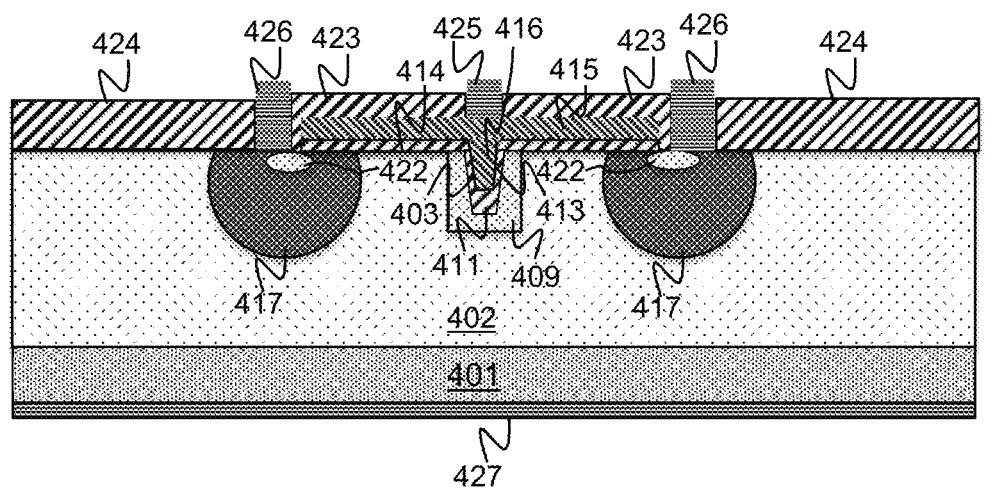
FIG. 4J shows a cut away side view of formation of other structures on the integrated planar-trench gate transistor device according to aspects of the present disclosure.

FIG. 4J shows a cut away side view of formation of other structures on the integrated planar-trench gate transistor device according to aspects of the present disclosure. An isolation layer 424 is formed on the surface of the epitaxial layer 402 after formation of the source region(s) 422. The Isolation layer may be for example and without limitation, a silicon oxide deposited on the surface of the epitaxial layer. The Isolation layer may also cover 423 the integrated gate trench completing the insulation layer for gate. A source contact mask is applied to the isolation layer 424 over the source region(s) 422 and body region(s) 417 of the epitaxial layer. The isolation layer is etched away and a source contact metal 426 is deposited on the surface of the epitaxial layer 402 over the source region 422 and body region 417. A gate contact mask is applied to the gate insulation 426 the gate contact is etched away and a gate contact metal 425 is deposited on the conductive layer 415 of the gate. Etching for the gate contact and source contact may be performed by using plasma dry etching, after the etch the gate contact mask and source contact mask may be removed by plasma ashing and washing with a suitable mask removal solution or any other known mask removal technique such as without limitation planarization or polishing. A drain conductive layer 427 may be formed on the backside of the substrate 401. The drain conductive layer 427 may be for example and without limitation, a metal deposited on the back of the substrate 401.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An transistor device, comprising:
a substrate heavily doped with a first conductivity type;
a epitaxial layer lightly doped with the first conductivity type on top of the substrate;
a body region doped with a second conductivity type formed in the epitaxial layer wherein the second conductivity type is opposite the first conductivity type;
a source region doped with the first conductivity type formed in the body region of the epitaxial layer;
an integrated planar-trench gate having a planar gate portion formed on a surface of the epitaxial layer that is contiguous with a gate trench portion formed in a trench in the epitaxial layer, wherein the sides and bottom of the trench are doped with the first conductivity type wherein a localized JFET implant region heavily doped with the first conductivity type is located around the sides and bottom of the trench.

2. The transistor device of claim 1 wherein the trench gate portion is formed in the body region of the epitaxial layer.

3. The transistor device of claim 1 wherein the depth of a bottom of the trench gate portion in the substrate is less than the lowest doped depth of the body region.

4. The transistor device of claim 1 wherein a region of the epitaxial layer lightly doped with the first conductivity type separates the localized JFET implant and the body region.

5. The transistor device of claim 1 further comprising a thick insulating layer at a bottom of the trench wherein the thick insulating layer at the bottom of the trench is thicker than insulating layer a least one side of the trench.

6. The transistor device of claim 1 wherein the epitaxial layer further includes alternating body region columns doped with the second conductivity type and columns of epitaxial layer lightly doped with the first conductivity type.

7. The transistor device of claim 1 wherein sidewalls of a trench of the gate trench portion intersect with a bottom of the trench of the gate trench portion at an angle that is greater than 90 degree with respect to a surface of the epitaxial layer.

8. The transistor device of claim 1 wherein the gate trench portion has a trench depth of between 0.3 and 0.8 micrometers.

9. The transistor device of claim 1 wherein a width of an insulating layer at the bottom a trench of the gate trench portion is 1.5 to 2 times as thick as insulating layer on a side of the trench.

10. A method for making a transistor device, comprising:
forming an epitaxial layer lightly doped with a first conductivity type on a substrate heavily doped with the first conductivity type wherein the first conductivity type is opposite a second conductivity type;
forming a trench in the epitaxial layer;
doping the sides and bottom of the trench with the first conductivity type to create a localized JFET implant region heavily doped with the first conductivity type around the sides and bottom of the trench;
forming an insulating layer on the surface of the epitaxial layer and in the trench; and
creating integrated planar-trench gate by forming a contiguous conductive layer over the insulating layer on the surface of the epitaxial layer and in the trench.

11. The method of claim 10 further comprising forming a thick bottom insulating layer on the bottom of the trench before forming the insulating layer on the surface of the epitaxial layer and in the trench.

12. The method of claim 10 wherein the sides and bottom of the trench are doped with the first conductivity type to create a localized JFET implant region heavily doped with the first conductivity type around the sides and bottom of the trench before forming the insulating layer.

13. The method of claim 10 further doping a region of the epitaxial with the second conductivity type to form a body region.

14. The method of claim 13 wherein the trench is formed in the body region of the epitaxial layer.

15. The method of claim 13 wherein forming the body region further comprises forming alternating columns doped with the first conductivity type and the second conductivity type respectively.

16. The method of claim 13 wherein the body region is doped deeper than the bottom of the trench.

17. The method of claim 13 further comprising forming a source region in the body region of the epitaxial layer.

18. The method of claim 10 wherein the insulating layer at a bottom of the trench is 1.5 to 2 times as thick as the insulating layer at a side of the trench.

19. The method of claim 10 wherein forming the trench further comprises forming sidewalls of the trench that intersect a bottom of the trench at an angle greater than 90 degrees.

* * * * *